(12) United States Patent
Wright et al.

(10) Patent No.: US 12,234,553 B2
(45) Date of Patent: Feb. 25, 2025

(54) CVD REACTOR WITH CARRYING RING FOR SUBSTRATE HANDLING, AND USE OF A CARRYING RING ON A CVD REACTOR

(71) Applicant: AIXTRON SE, Herzogenrath (DE)

(72) Inventors: Benjamin David Wright, Cambridge (GB); Barry O'Neil, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 616 days.

(21) Appl. No.: 15/734,736

(22) PCT Filed: Jun. 4, 2019

(86) PCT No.: PCT/EP2019/064392
§ 371 (c)(1),
(2) Date: Dec. 3, 2020

(87) PCT Pub. No.: WO2019/233965
PCT Pub. Date: Dec. 12, 2019

(65) Prior Publication Data
US 2021/0238740 A1 Aug. 5, 2021

(30) Foreign Application Priority Data
Jun. 6, 2018 (DE) .................. 10 2018 113 400.2

(51) Int. Cl.
*C23C 16/458* (2006.01)
*C23C 16/32* (2006.01)

(52) U.S. Cl.
CPC ........ *C23C 16/4585* (2013.01); *C23C 16/325* (2013.01); *C23C 16/4584* (2013.01)

(58) Field of Classification Search
CPC .................................................. C23C 16/4584
See application file for complete search history.

(56) References Cited

U.S. PATENT DOCUMENTS

| 5,911,461 A | 6/1999 | Sauter et al. |
| 2001/0047762 A1 | 12/2001 | Hayashi |

(Continued)

FOREIGN PATENT DOCUMENTS

| DE | 19940033 A1 | 5/2001 |
| DE | 102 32 731 A1 | 2/2004 |

(Continued)

OTHER PUBLICATIONS

Daniel DE102012106796A Jan. 2014 Eng trans (Year: 2014).*

(Continued)

*Primary Examiner* — Joseph A Miller, Jr.
(74) *Attorney, Agent, or Firm* — Ascenda Law Group, PC

(57) ABSTRACT

A susceptor assembly, which is situated in a reactor housing, has at least one wide side plane that faces a process chamber, at least one pocket, and a carrying element that lies in the at least one pocket, for carrying and handling a substrate. An upper face of the carrying element is adjacent to a limiting face of a recess in which the substrate is arranged. A section (Continued)

of the limiting face which runs along a cylinder inner lateral face merges into the upper face of the carrying element, forming a rounded edge or chamfer. To reduce the growth of parasitic deposits on an inner edge of the carrying element, the section of the limiting face which runs along the cylinder inner lateral face has a height which is greater than the material thickness of the substrate, and the radius of the rounded edge is greater than 0.4 mm.

8 Claims, 4 Drawing Sheets

(56) References Cited

U.S. PATENT DOCUMENTS

| | | |
|---|---|---|
| 2004/0175939 A1 | 9/2004 | Nakamura et al. |
| 2006/0102081 A1 | 5/2006 | Ueno et al. |
| 2006/0269390 A1 | 11/2006 | Nakamura et al. |
| 2009/0308319 A1 | 12/2009 | Cheng et al. |
| 2010/0216261 A1* | 8/2010 | Brenninger ............. C30B 33/02 438/14 |
| 2011/0143016 A1 | 6/2011 | Hong et al. |
| 2012/0156374 A1 | 6/2012 | Gurary et al. |
| 2015/0075431 A1* | 3/2015 | Barriss ................... C30B 25/12 118/725 |
| 2015/0187620 A1 | 7/2015 | Gurary et al. |
| 2016/0172165 A1 | 6/2016 | Jeon et al. |

FOREIGN PATENT DOCUMENTS

| | | |
|---|---|---|
| DE | 10 2005 018 162 A1 | 10/2006 |
| DE | 10 2005 018 161 A1 | 11/2006 |
| DE | 10 2009 010 555 A1 | 9/2010 |
| DE | 10 2011 053 498 A1 | 3/2013 |
| DE | 10 2012 106 796 A1 | 1/2014 |
| DE | 10 2013 111 165 A1 | 4/2015 |
| DE | 10 2014 114 947 A1 | 11/2015 |
| DE | 10 2014 117 388 A1 | 6/2016 |
| DE | 10 2016 103 530 A1 | 8/2017 |
| DE | 11 2016 003 443 T5 | 4/2018 |
| DE | 10 2017 101 648 A1 | 8/2018 |
| EP | 2498277 A1 | 9/2012 |
| JP | 2016-012680 A | 1/2016 |
| JP | 2016-035080 A | 3/2016 |

OTHER PUBLICATIONS

International Search Report mailed Sep. 30, 2019, from the ISA/European Patent Office, for International Patent Application No. PCT/EP2019/064392 (filed Jun. 4, 2019), 6 pages.

Written Opinion mailed Sep. 30, 2019, from the ISA/European Patent Office, for International Patent Application No. PCT/EP2019/064392 (filed Jun. 4, 2019), 10 pages.

International Search Report mailed Sep. 30, 2019, from the ISA/European Patent Office, for International Patent Application No. PCT/EP2019/065688 (filed Jun. 14, 2019), 8 pages.

Written Opinion mailed Sep. 30, 2019, from the ISA/European Patent Office, for International Patent Application No. PCT/EP2019/065688 (filed Jun. 14, 2019), 8 pages.

International Search Report mailed Nov. 20, 2019, from the ISA/European Patent Office, for International Patent Application No. PCT/EP2019/065721 (filed Jun. 14, 2019), 12 pages.

Written Opinion mailed Nov. 20, 2019, from the ISA/European Patent Office, for International Patent Application No. PCT/EP2019/065721 (filed Jun. 14, 2019), 16 pages.

International Preliminary Report on Patentability issued Dec. 8, 2020, from The International Bureau of WIPO, for International Patent Application No. PCT/EP2019/064392 (filed Jun. 4, 2019), 19 pgs.

International Preliminary Report on Patentability issued Dec. 15, 2020, from The International Bureau of WIPO, for International Patent Application No. PCT/EP2019/065688 (filed Jun. 14, 2019), 18 pgs.

International Preliminary Report on Patentability issued Dec. 22, 2020, from The International Bureau of WIPO, for International Patent Application No. PCT/EP2019/065721 (filed Jun. 14, 2019), 33 pgs.

Written Opinion mailed Sep. 30, 2019, from the ISA/European Patent Office, for International Patent Application No. PCT/EP2019/064392 (filed Jun. 4, 2019), English translation, 7 pgs.

Written Opinion mailed Sep. 30, 2019, from the ISA/European Patent Office, for International Patent Application No. PCT/EP2019/065688 (filed Jun. 14, 2019), English translation, 8 pgs.

Written Opinion mailed Nov. 20, 2019, from the ISA/European Patent Office, for International Patent Application No. PCT/EP2019/065721 (filed Jun. 14, 2019), English translation, 15 pgs.

Restriction Requirement dated Aug. 25, 2023, for U.S. Appl. No. 17/250,221, filed Dec. 17, 2020, 9 pgs.

\* cited by examiner

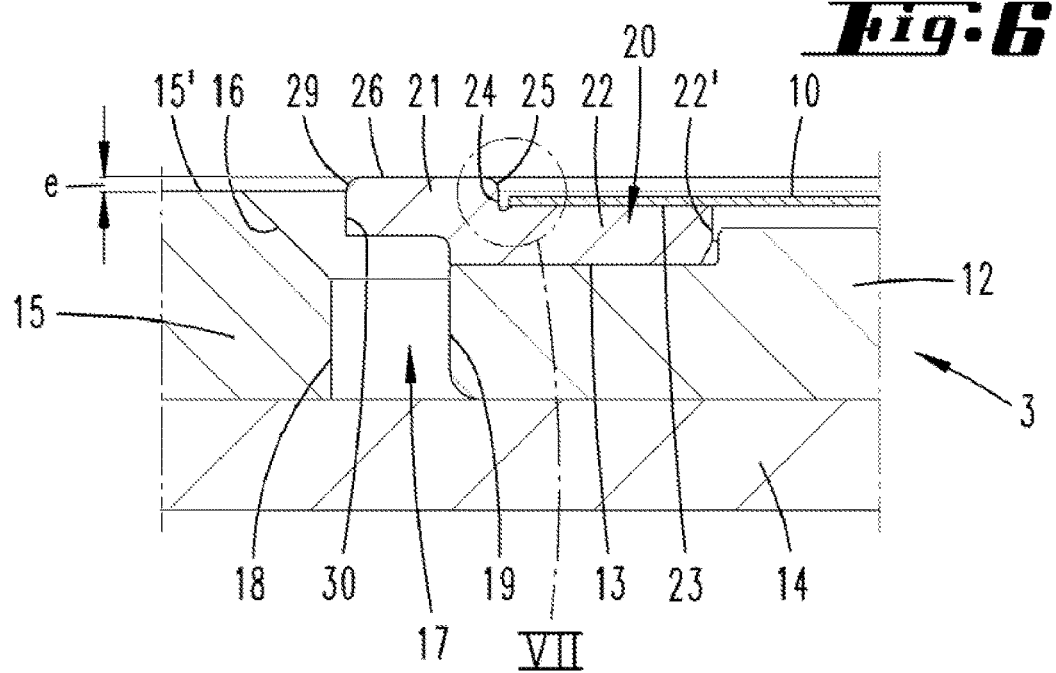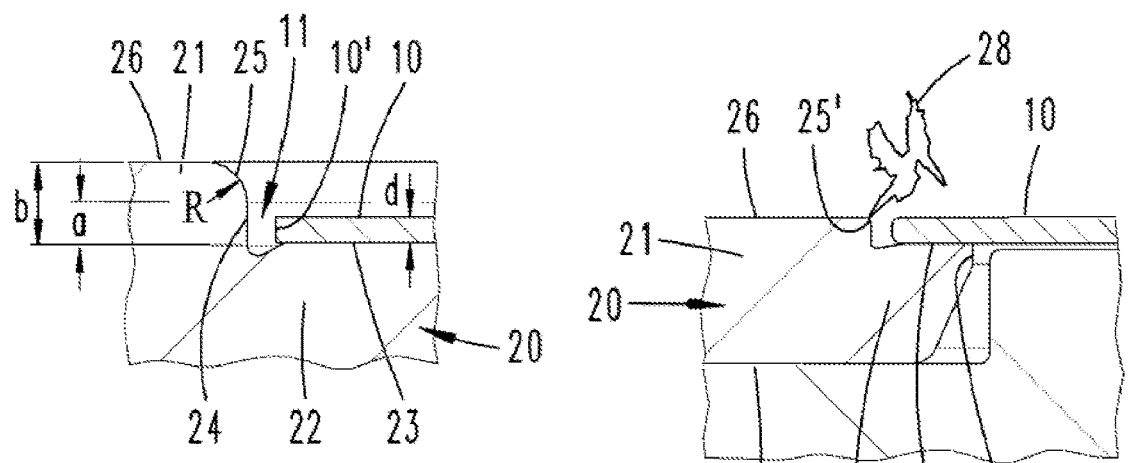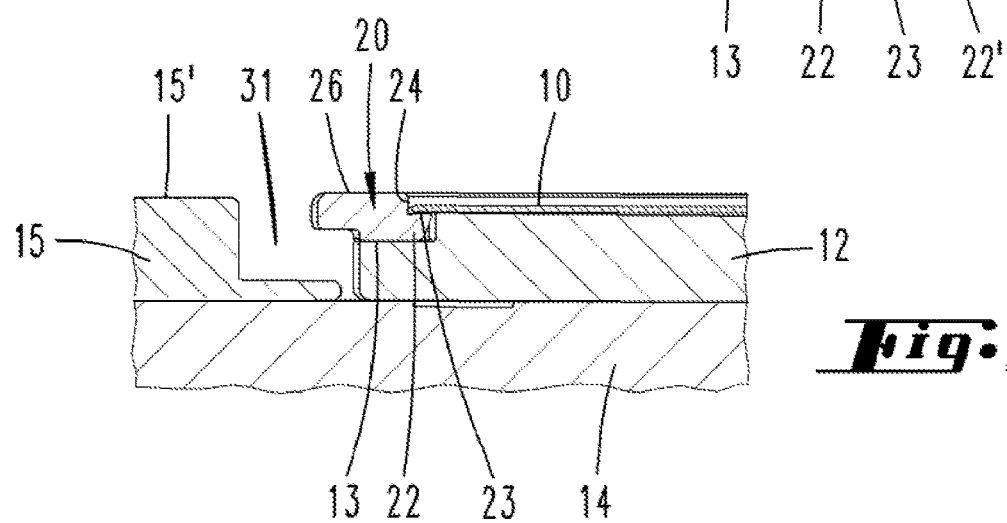

CVD REACTOR WITH CARRYING RING FOR SUBSTRATE HANDLING, AND USE OF A CARRYING RING ON A CVD REACTOR

RELATED APPLICATIONS

This application is a National Stage under 35 USC 371 of and claims priority to International Application No. PCT/EP2019/064392, filed 4 Jun. 2019, which claims the priority benefit of DE Application No. 10 2018 113 400.2, filed 6 Jun. 2018.

FIELD OF THE INVENTION

The invention relates to a device for depositing layers composed in particular of decomposition products of gaseous starting materials, which in particular contain silicon and carbon, onto one or several substrates, with a susceptor assembly that is arranged in a reactor housing and has at least one wide side plane which faces a process chamber and has a pocket, and with a carrying ring lying in the at least one pocket for carrying and handling the substrate, wherein an upper face of the carrying ring extending parallel to the wide side plane is adjacent to a limiting face of a recess in which the substrate can be arranged.

In addition, the invention also relates to a carrying ring for use on such a device or to a method for depositing layers, which consist in particular of carbon and silicon.

In addition, the invention relates to a use of such a carrying ring.

BACKGROUND

A generic device suitable in particular for depositing SiC has a process chamber, which is arranged in a reactor housing and in particular can also be evacuated. A floor of the process chamber is comprised of a susceptor assembly. The susceptor assembly can be heated from below. The process chamber arranged above the susceptor assembly is bounded from above by a process chamber cover. A gas inlet member opens out into the process chamber, and serves to admit gaseous starting materials, which in particular contain carbon and silicon. The process chamber or the wide side plane of the susceptor assembly that faces the process chamber is heated to process temperatures at which the starting materials, which can be silane and methane or other silicon-hydrogens or carbon-hydrogens, decompose, so that silicon carbide layers are deposited on substrates carried by the susceptor assembly. This takes place at temperatures above 1000 degrees Celsius, in particular above 1300 degrees Celsius or 1500 degrees Celsius.

Carrying rings that lie in pockets of the susceptor assembly are provided for handling the substrates, wherein edges of the essentially circular substrates rest on support surfaces of the carrying ring, at least while handling the substrates. A gripper having two gripping fingers that extend parallel to each other can be used to reach under a radially outer section of the carrying ring, so as to lift it out of the pocket of the susceptor assembly. To this end, the susceptor assembly preferably has channels open toward the edge, into which the gripping fingers can engage.

The prior art includes the following publications: DE 102 32 731 A1, DE 10 2016 103 530 A1, DE 10 2005 018 161 A1 and US 2016/0172165 A1, DE 10 2012 106 796 A1 and DE 10 2017 101 648 A1.

In devices of the kind currently used for depositing SiC, the upper face of the carrying ring transitions into a cylinder inner face in an essentially sharp-edged manner, which surrounds the edge of the substrate. The distance between the support surface for supporting the edge of the substrate on the carrying ring and the upper face of the supporting ring there essentially corresponds to the material thickness of the substrate, so that the substrate surface runs on the same level on which the upper face of the carrying ring also runs.

In such an embodiment of the carrying ring, particle formation on the peripheral edge of the carrying ring is observed during its use for depositing SiC layers. These "whisker", "dendrite", or tooth-shaped parasitic deposits have a negative effect on the deposition result.

SUMMARY OF THE INVENTION

The object of the invention is to take measures for preventing the formation of such deposits on the edge of the carrying ring.

The object is achieved by the invention indicated in the claims, wherein the subclaims describe not only advantageous further developments of the independent claims, but also standalone solutions to the object.

It is initially and essentially proposed that the peripheral edge of a carrying element, which consists of a carrying ring, be rounded or chamfered in such a way as to diminish particle deposition there. As opposed to prior art, where essentially one upper face of the carrying element transitions into a limiting face extending along a cylinder inner lateral face with the formation of a sharp, possibly only chamfered border, the edge according to the invention is rounded or designed as a chamfer. The essentially flat upper face of the carrying element preferably transitions into a toroidal face without any kinks. The toroidal face represents the rounded area, and transitions flush, meaning without any kinks, into the limiting face extending along a cylinder inner lateral face. The rounding radius is to measure at least 0.1 mm. In a preferred embodiment, the rounding radius is greater than 0.2 mm, 0.3 mm, 0.4 mm, or 0.5 mm. The rounded peripheral edge with which the upper face transitions into the limiting face can be directly adjacent to a support surface on which the edge of the substrate rests. However, a preferred embodiment provides that the rounded edge transition into a cylinder inner lateral face area. In an alternative where the limiting face transitions into the upper face of the ring with the formation of a chamfer, the chamfer preferably has a width of 0.2 mm, 0.3 mm, 0.4 mm, or 0.5 mm. The edge of the substrate preferably lies opposite the area of the limiting face extending along a cylinder inner lateral face. The distance between a plane in which the upper face of the carrying element extends and a second plane in which the support surface of the carrying element extends is preferably greater than the material thickness of the substrate. The carrying element can be a closed ring. It can have a circular or even a noncircular outline. However, the carrying element can also be composed of several parts. The distance preferably measures at least 1 mm given a material thickness of the substrate of about 0.5 m. The height of the area of the limiting face extending on a cylinder inner lateral face as measured in the direction of the surface normal of the support surface is preferably greater than the material thickness of the substrate. However, it can also correspond to the material thickness of the substrate or be slightly less than the material thickness of the substrate. The height of this area of the limiting face can be greater or less than the radius of the rounded corner or the width of the chamfer. In particular, it is provided that the height of the cylinder inner section of the limiting face be less than half the distance between the support surface and upper face of the carrying ring. The diameter of the limiting face is slightly greater than the diameter of the substrate, specifically in such a way that the distance between an edge of the substrate and the limiting face, and in particular the cylinder inner area of the limiting face, is less than the radius of the rounded corner or the chamfer. The carrying ring can have a radially inner area and a radially outer area. The radially inner area of the carrying ring lies at least sectionally on a supporting flank of a substrate holder. The substrate holder here comprises a pedestal-shaped, in particular circular disk-shaped object, which rests on the upper face of a susceptor. Means, for example gas outlet openings, can be arranged on the upper face of the susceptor, with which the substrate holder is held suspended relative to the upper face. For example, a gas stream exits gas outlet openings, forming a gas cushion on which the substrate holder rests. A suitable direction of the gas outlet nozzles can impart a rotation to the substrate holder around its figure axis. The carrying ring resting on the substrate holder and the substrate carried by the carrying ring are thus rotary driven while executing the deposition process. The substrate can rest on the carrying ring with its edge. However, it can also rest on the substrate holder. In particular, the upper face of the substrate holder can have support projections arranged on a circular arc line, on which the substrate rests, so that it is only mounted at specific points. The substrate holder lies in a pocket, which can be formed by one or several cover plates that rest on the susceptor. An inner wall of the pocket can be spaced apart from a circumferential wall of the substrate holder. Channels that are tangent to the carrying ring on two diametrically opposite sides can proceed from the radially outer edge of the preferably circular susceptor assembly. Fingers of a carrying arm can engage into these channels, so as to lift the carrying ring with the substrate carried by it and convey it out of the process chamber. A further development of the invention provides that the edge of the pocket be formed by a chamfer. The chamfer is adjacent to the wide side face of the susceptor assembly and to an inner wall of the pocket comprised of a cylinder inner lateral face. The height of the chamfer measured in the direction of the surface normal of the wide side face is preferably greater than the height extension of the carrying ring.

A carrying ring according to the invention has an upper face extending in a wide side plane and a lower face running parallel thereto, wherein the upper face is allocated in particular to a radially outer area, and the lower face in particular to a radially inner area. The radially inner area additionally has a support surface for supporting the edge of the substrate, which is spaced apart from the upper face of the carrying ring by more than the material thickness of the substrate. According to the invention, the upper face transitions into the limiting face with the formation of a rounded corner or a chamfer, which extends in the circumferential direction around the edge of the substrate, and which can have an area that extends along a cylinder jacket wall of an inner cylinder. In particular, the invention relates to a CVD reactor, a susceptor assembly, a carrying ring or the use of a carrying ring, wherein, in a radial cross sectional surface running through a central axis of the ring, the rounded edge extends without any kinks along an arc section, which is at least 0.3 mm, 0.4 mm, 0.5 mm, or 0.6 mm long and runs curved at least in the area of its end points adjacent to the flat upper face and the cylindrical limiting face. It is here advantageous that the arc section runs out smoothly without any kinks at its end points into the upper face or limiting face.

BRIEF DESCRIPTION OF THE DRAWINGS

The invention will be described in more detail below based on exemplary embodiments. Shown on:

FIG. 6 is an illustration according to FIG. 4 of a second exemplary embodiment, FIG. 7 is an illustration according to FIG. 5 of a second exemplary embodiment, FIG. 8 is an illustration according to FIG. 5, but in prior art, FIG. 9 is the section according to line IX-IX on FIG. 3.

DETAILED DESCRIPTION

Figure 1:
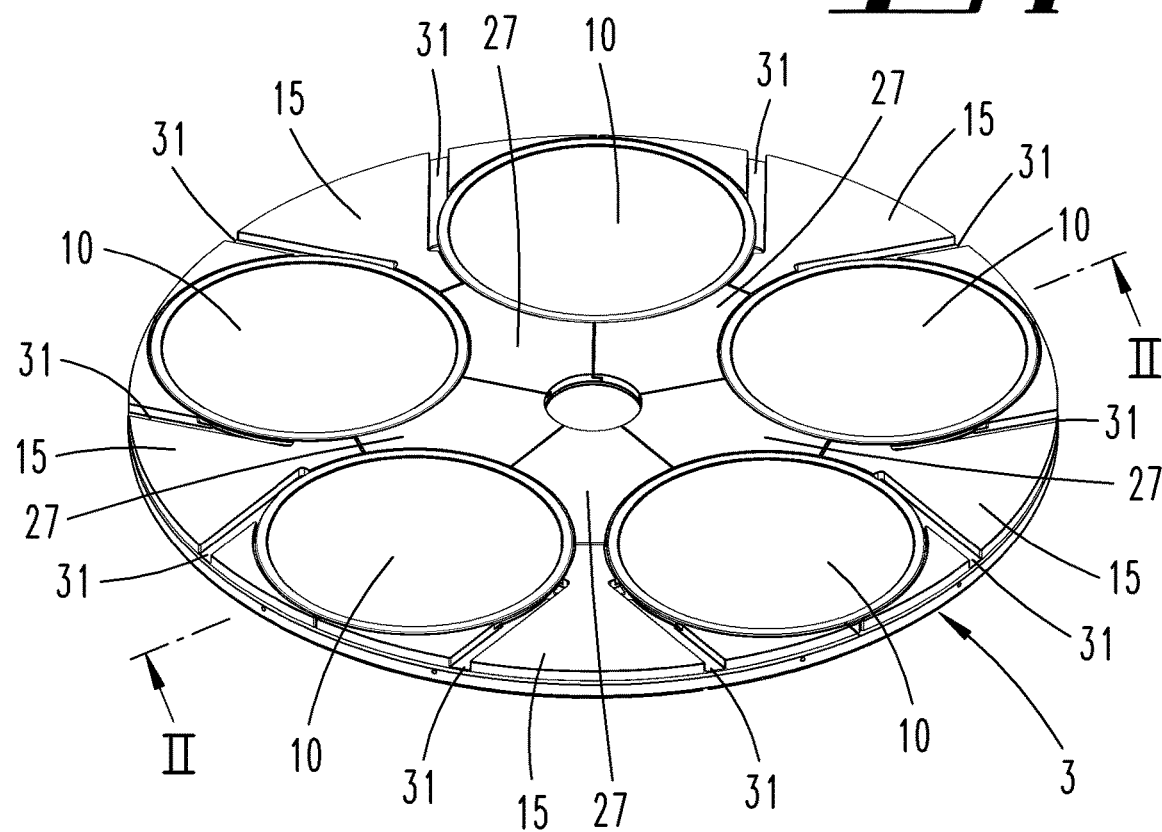
FIG. 1 is a perspective view of the susceptor assembly.
Figure 2:
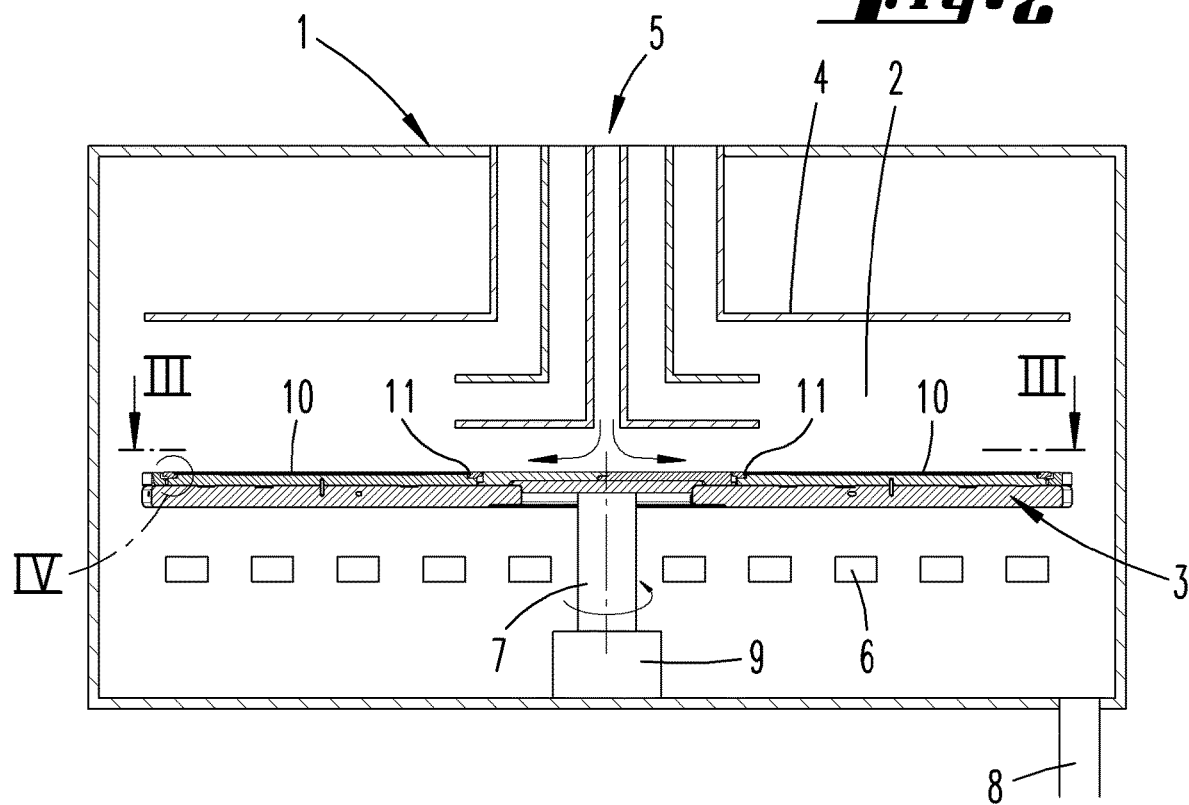
FIG. 2 is a schematic cross section through a CVD reactor.
Figure 3:
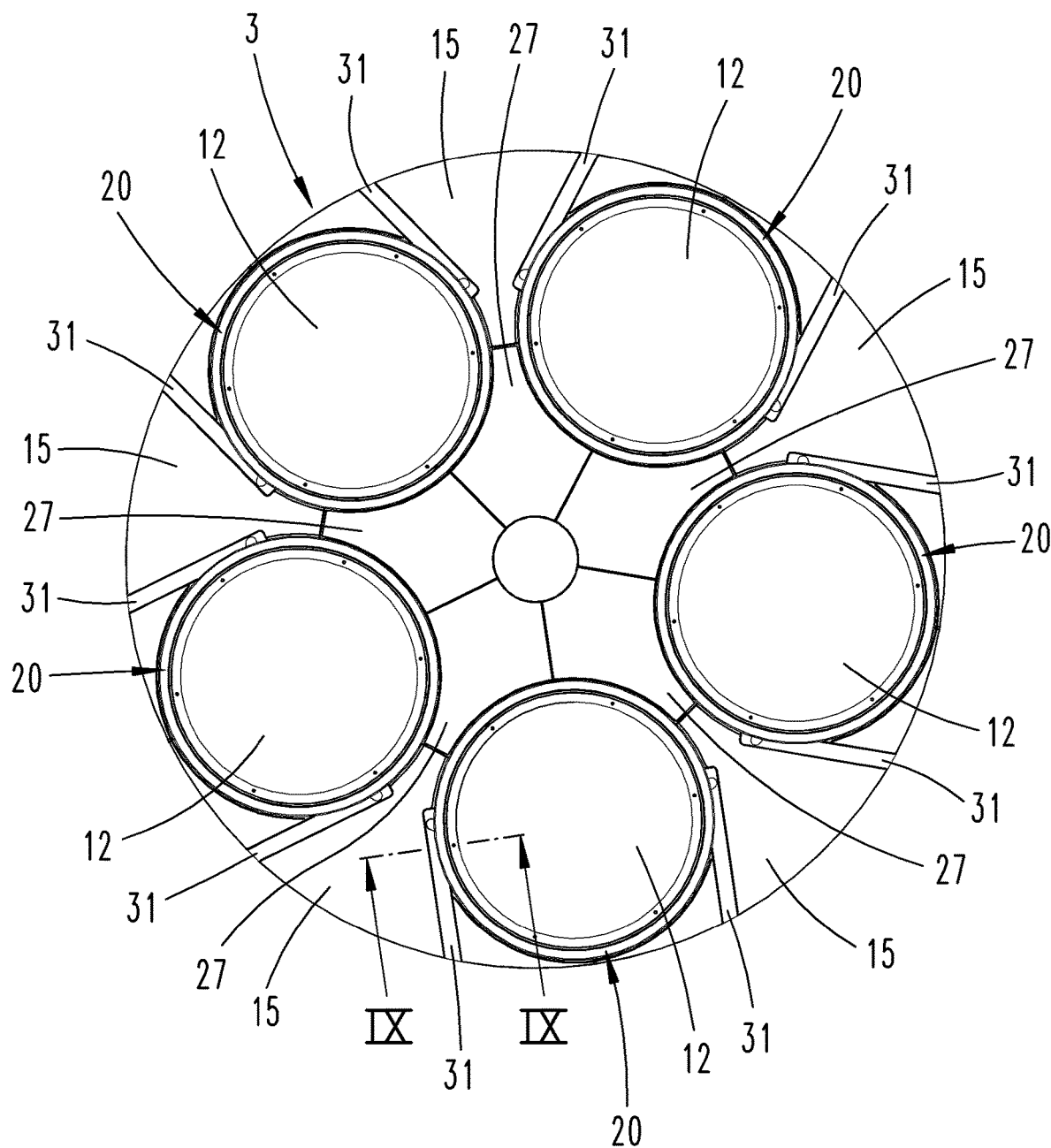
FIG. 3 is the susceptor assembly in a top view roughly according to the section plane III-III on FIG. 2.

FIG. 2 shows a CVD reactor 1 with a housing made out of stainless steel, which seals a process chamber 2 arranged therein gastight to the outside, and which can be evacuated. Process gases, for example a silicon-hydrogen and a carbon-hydrogen, together with a carrier gas, for example $H_2$, can be fed into the process chamber through a gas inlet member 5. The process chamber 2 is capped at the top by a process chamber cover 4. The infeed of process gases takes place in a center of the essentially rotationally symmetrical process chamber 2. The floor of the process chamber 2 is comprised of a susceptor assembly 3 of the kind shown on FIGS. 1 and 3. The susceptor assembly 3 is comprised of a susceptor 14 consisting in particular of graphite or coated graphite, which forms a circular disk-shaped carrying body, on which the substrates 10 are circularly arranged around the center of the susceptor assembly 3. A rotary drive 9 is provided to rotationally drive the susceptor assembly 3 around a rotational axis 7. Located below the susceptor assembly 3 is a heating device 6, with which the susceptor assembly 3 can be heated to a process temperature. At this process temperature, the initial materials fed into the process chamber 2 through the gas inlet member decompose in such a way that a silicon carbide layer is deposited onto the substrate 10. Reaction products then exit the process chamber 2 together with the carrier gas through a gas outlet 8.

Outer cover plates 15 and inner cover plates 27 are located on the upper face of the susceptor 14 that forms a carrying body. The upper faces of the cover plates 15, 27 form a wide side face 15' of the susceptor assembly 3. Several openings are located in this wide side face 15'. The openings are comprised of pockets 17. Located in each pocket 17 is a substrate holder 12, which rests on a gas cushion (not shown in the drawings) between the upper face of the susceptor 14 and lower face of the substrate holder 12. The gas cushion is comprised of a carrier gas exiting gas outlet openings in the susceptor upper face, wherein the gas outlet openings are aligned in such way as to impart rotation to the substrate holder 12 in its figure axis.

An edge area of the circular disk-shaped substrate holder 12 forms a supporting flank 13, upon which rests a radially inner area 22 of a carrying ring 20. An inner wall 22' of the carrying ring 20 here abuts against the stepped wall that is adjacent to the supporting flank 13. The radially inner area 22 of the carrying ring 20 has a support surface 23, upon which rests a radially outer edge section of the substrate 10 in the exemplary embodiment shown on FIGS. 6 and 7. The lower face of the substrate 10 is here spaced apart from the upper face of a central area of the substrate holder by a distance c, wherein the distance c can be somewhat greater or less than the material thickness d of the substrate 10, which can be below one millimeter.

Figure 4:
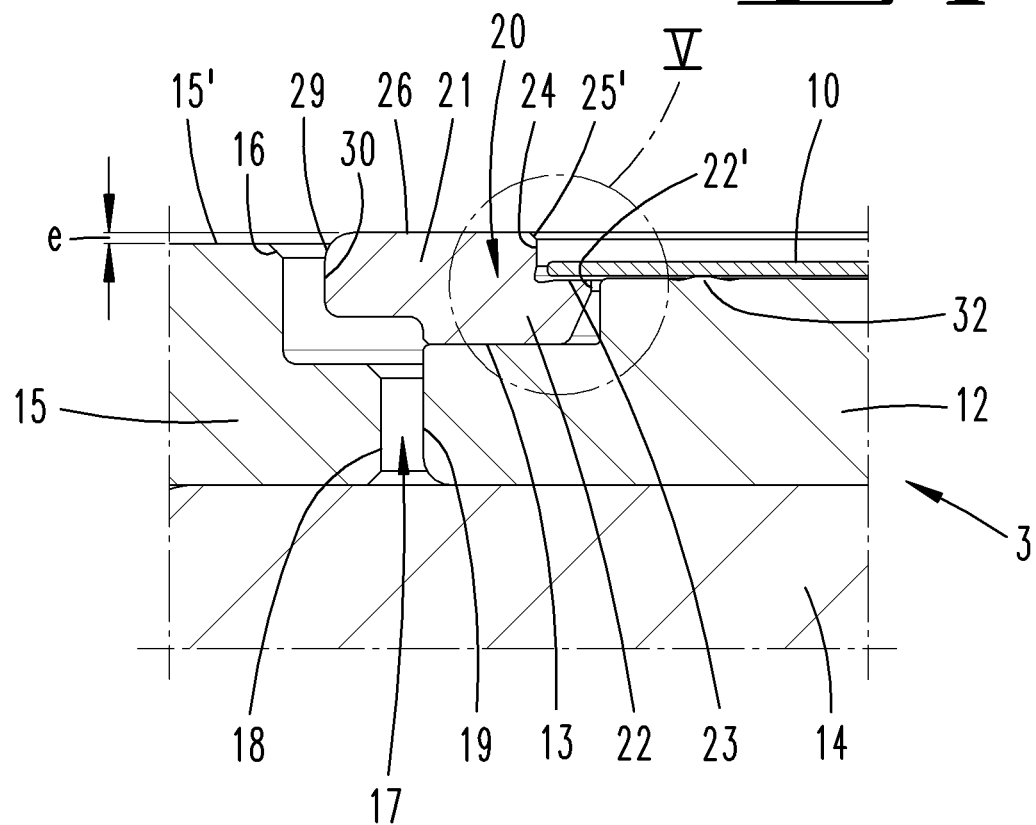
FIG. 4 is the cutout IV on FIG. 2.
Figure 5:
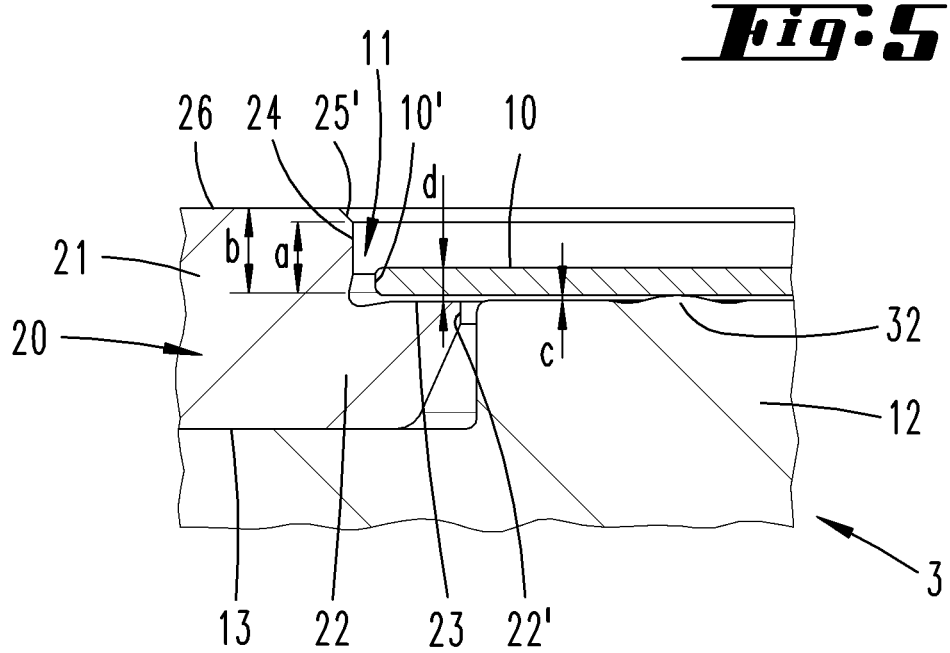
FIG. 5 is a magnified view of the cutout V on FIG. 4 of a first exemplary embodiment.

In the exemplary embodiment shown on FIGS. 4 and 5, the substrate holder 12 has a plurality of support projections 32, which are arranged on a circular arc line around the center of the substrate holder 12 and support the substrate 10, so that it has a distance c from the upper face of the substrate holder 12. The support surface 23 here runs in the same plane in which the upper face of the substrate holder 12 runs, so that the lower face of the substrate 10 is spaced slightly apart from the support surface 23. In the exemplary embodiment shown on FIGS. 4 and 5, the edge area of the substrate 10 only comes into contact with the support surface 23 if the carrying ring 20 is used as an element for transporting the substrate 10.

The support surface 23 is adjacent to a limiting face 24 in a radial outer direction. A circumferential groove in the support surface 23 extends in the area adjacent to the limiting face 24.

The area of the limiting face 24 adjacent to the support surface 23 extends on a cylinder inner lateral face, and has a height a greater than the material thickness d of the substrate 10. The height a preferably measures at least 0.5 mm.

In the exemplary embodiment shown on FIGS. 6 and 7, which is the preferred exemplary embodiment, the upper face 26 of the carrying ring 20 running in a parallel plane to the wide side face 15' and in particular the upper face 26 of the radially outer area 21 of the carrying ring 20 transitions flush into the limiting face 24 extending on a cylinder inner lateral face, with the formation of a toroidal face. The toroidal face thus forms a rounded corner 25. The rounding radius R of the rounded corner 25 is greater than 0.4 mm, preferably greater than 0.5 mm. The sum of the height a and radius R corresponds to a spaced distance b in a first plane, in which the upper face 26 extends, and a second plane, in which the support surface 23 extends. The clearance b is less than double the clearance a. The height difference between the support surface 23 and upper face 26 preferably measures at least 1 mm.

In the exemplary embodiment shown on FIGS. 4 and 5, the upper face 26 transitions into the inner wall 24 with the formation of a chamfer 25' that extends on a cone surface. The chamfer width is here preferably greater than 0.4 mm or greater than 0.5 mm. The height of the chamfer here corresponds to the radius R. It is less than the clearance a. The clearance b is here also less than double the clearance a. The chamfer 25' can also run out into the inner wall 24 or upper face 26 without any kinks. The chamfer 25' can also have several chamfers adjacent to it, so that the cross section can also run like a polygon.

The radially outer area 21 of the carrying ring 20 protrudes over a circumferential wall 19 of the substrate holder 12. A gripper not shown in the drawings can reach below the resultantly formed overhang extending around the entire circumference of the supporting ring 20. To this end, a gripping arm has two gripping fingers running parallel to each other, which can reach below the radial overhang of the carrying ring at the diametrically opposite sections.

The cover plates 15 form channels 31, into which the gripping fingers of the gripping arm can engage.

It is further provided that a plane in which the upper face 26 extends has a distance to a plane in which the wide side plane 15' extends. The distance e corresponds to roughly the rounding radius R of the rounded corner 25 or the width or height of the chamfer 25', but can also be less than the radius R. In particular, it is provided that the distance between the upper face 26 and the upper face of the susceptor 14 be greater than the distance between the wide side plane 15' and the upper face of the susceptor 14. The radially outer area 21 of the carrying ring 20 thus comprises of a circular elevation from the wide side plane 15', wherein both the inner peripheral edge 25 of this elevation as well as the outer peripheral edge 29 of this elevation are rounded or chamfered. The two rounding radii of the rounded corners 25, 29 can be identical. However, the corners 25, 29 can also form chamfers instead of rounded areas.

It is further provided that an inner wall 18 of the pocket 17 extending along a cylinder inner lateral wall lie at a distance opposite a circumferential wall 19 of the substrate holder 12 extending on a cylinder outer lateral wall. The inner wall 18 of a cover plate 15 can be adjacent to a chamfer 16. The chamfer 16 is adjacent to the wide side plane 15'. The height of the chamfer 16 measured in the direction of the surface normal of the wide side plane 15' can be greater than the material thickness of the carrying ring 20. In particular, it is provided that the height of the circumferential wall 19 be greater than the height of the section of the inner wall 18 extending on a cylinder inner lateral wall. The material thickness of the carrying ring 20 can measure about 3 mm. An outer surface 30 that runs on a cylinder lateral wall and forms the outer boundary of the carrying ring 20 can lie opposite the chamfer 16.

FIG. 8 shows an assembly similar to the assembly shown on FIG. 7, but according to prior art. The transition corner between the wide side plane 15' and limiting face 24 is here sharp-edged. When depositing SiC at temperatures exceeding 1300 degrees Celsius, parasitic deposits 28 form at the transition corner 25', which influence the flow of the process gases over the surface of the substrate 10 or the cover plates 15 and 27.

The configuration of the edge area shown on FIG. 5 or 7 brings about a diminished formation of such parasitic deposits 28, wherein the diminished formation of parasitic deposits 28 is significant with the rounded area shown on FIG. 7.

According to the invention, the term rounded area or rounded edge or rounded corner is understood not just as a transitional area between a flat surface and an inner cylinder face that runs toroidally, i.e., has a cross section shaped like a quarter-circle arc, but also includes those transitional areas whose cross section is a polygonal line, wherein the individual line elements of the polygonal line extending over an angle of 90° merge into each other in a rounded manner, so that the transitional area between a flat surface and inner cylinder face runs free of kinks.

The above statements serve to explain the inventions encompassed by the application as a whole, which each also independently further develop the prior art at least by the following feature combinations, specifically:

A device, characterized in that the limiting face 24 transitions into the upper face 26 of the ring 20 with the formation of a rounded edge 25 or a chamfer 25'.

A device, characterized in that a support surface 23 for supporting an edge of the substrate 10 formed by a radially inner area 22 of the carrying ring 20 is spaced apart from the upper face 26 by a distance b greater than the material thickness d of the substrate 10.

A device, characterized in that a section 24 of the limiting face that runs essentially along a cylinder inner lateral face has a height a which is greater than the material thickness d of the substrate 10 and/or which is greater than the radius R of the rounded corner 25 or the chamfer 25' and/or which is less than half the distance b between a plane in which the support surface 23 extends and a plane in which the upper face 26 extends.

A device, characterized in that the distance between an edge 10' of the substrate 10 and a section 24 of the limiting face running along a cylinder inner lateral face is less than the radius R of the rounded corner 25 or the width of the chamfer 25'.

A device, characterized in that the radius R of the rounded corner 25 or the width of the chamfer 25' measures at least 0.4 mm, preferably at least 0.5 mm and/or that the upper face 26 transitions into a circumferential surface 30 with the formation of a second rounded corner 29 or a second chamfer, wherein the radius of the second rounded corner 29 or the second chamfer measures at least 0.4 mm, preferably at least 0.5 mm.

A device, characterized in that the radially inner area 22 of the carrying ring 20 rests on a support flank 13 of a substrate holder 12, wherein the substrate holder 12 rests on the upper face of a susceptor 14 and is arranged above a heating device 6, with which the susceptor assembly 3 can be heated, wherein means are provided to impart a rotation to the substrate holder 12 along with the carrying ring 20 it carries and the substrate 10 carried by the carrying ring 20 around a figure axis of the substrate holder 12.

A device, characterized in that an inner wall 18 of the pocket 7 lying opposite a circumferential wall 19 of the substrate holder 12 is comprised of a cover plate 15, which rests on the susceptor 14 that forms a carrying body, and whose upper face comprises the wide side plane 15' of the susceptor assembly 3, wherein it is provided in particular that the upper face 26 of the radially outer area 21 of the carrying ring 20 protrude over the wide side plane 15' by a distance e.

A device, characterized in that the wide side plane 15' transitions into an inner face 18 of the pocket 17 that runs in particular along a cylinder inner lateral face with the formation of a chamfer 16, wherein it is provided in particular that the height of the chamfer 16 extending in the direction of the surface normal of the wide side plane is greater than the distance extending in the same direction of a lower face of the carrying ring 20, in particular a support surface, which rests on a support flank 13 of the substrate holder 12, and the upper face 26 of the carrying ring.

A carrying ring, characterized in that the limiting face 24 transitions into the upper face 26 with the formation of a rounded corner 25 or a chamfer 25'.

A carrying ring, characterized in that the radius R of the rounded corner 25 measures at least 0.4 mm, preferably at least 0.5 mm, and/or that a section 24 of the limiting face extending along a cylinder inner lateral face has a height a extending in the direction of the surface normal of the support surface 23 that is greater than the radius R.

All disclosed features (taken separately or in combination with each other) are essential to the invention. The disclosure of the application hereby also incorporates the disclosure content of the accompanying/attached priority documents (copy of preliminary application) in its entirety, also for the purpose of including features in these documents in claims of the present application. Even without the features of a referenced claim, the subclaims characterize independent inventive further developments of prior art with their features, in particular so as to initiate partial applications based on these claims. The invention indicated in each claim can additionally have one or several of the features indicated in the above specification, in particular those provided with reference numbers and/or included on the reference list. The invention also refers to embodiments in which individual features mentioned in the above specification are not realized, in particular to the extent they are obviously unnecessary for the respective intended application, or can be replaced by other technically equivalent means.

| REFERENCE LIST | |
|---|---|
| 1 | CVD reactor housing |
| 2 | Process chamber |
| 3 | Susceptor assembly |
| 4 | Process chamber cover |
| 5 | Gas inlet |
| 6 | Heating device |
| 7 | Rotational axis |
| 8 | Gas outlet |
| 9 | Rotary drive |
| 10 | Substrate |
| 10' | Edge of substrate |
| 11 | Recess |
| 12 | Substrate holder |
| 13 | Support flank |
| 14 | Carrying body |
| 15 | Cover plate |
| 16 | Chamfer |
| 17 | Pocket |
| 18 | Inner wall |
| 19 | Circumferential wall |
| 20 | Carrying element |
| 21 | Radially outer area |
| 22 | Radially inner area |
| 23 | Support surface |
| 24 | Inner wall |
| 25 | Rounded corner |
| 25' | Chamfer |
| 26 | Upper face |
| 27 | Cover plate |
| 28 | Deposition |
| 29 | Rounded edge |
| 30 | Outer flank |
| 31 | Channel |
| 32 | Projecting piece |
| a | Height |
| b | Distance |
| c | Distance |
| d | Material thickness |
| e | Distance |
| R | Radius |

The invention claimed is:

1. A device for depositing layers composed of decomposition products of gaseous starting materials onto a substrate (10), the device comprising:
   a reactor housing (1);
   a process chamber (2); and
   a susceptor assembly (3) arranged in the reactor housing (1), the susceptor assembly (3) comprising:
   a wide side plane (15') which faces the process chamber (2);
   a pocket (17); and
   a carrying element (20) lying in the pocket (17),
   wherein an upper face (26) of the carrying element (20) extending parallel to the wide side plane (15') is adjacent to a limiting face (24) of a recess (11) adapted to receive the substrate (10),
   wherein a cylindrical surface of the limiting face (24) transitions into the upper face (26) of the carrying element (20) with a transitional area that is free of kinks and has a radius (R) greater than 0.4 mm, and
   wherein a support surface (23) formed by a radially inner area (22) of the carrying element (20) is spaced apart from the upper face (26) by a distance (b) greater than 1 mm.

2. The device of claim 1, wherein at least one of:
(i) a height (a) of the cylindrical surface of the limiting face (24) is greater than the radius (R) of the transitional area or
(ii) the height (a) is less than half the distance (b).

3. The device of claim 1, wherein a distance between an edge (10') of the substrate (10) and the cylindrical surface of the limiting face (24) is less than the radius (R) of the transitional area.

4. The device of claim 1, wherein the radius (R) of the transitional area measures at least 0.5 mm.

5. The device of claim 1,
wherein the radially inner area (22) of the carrying element (20) rests on a support flank (13) of a substrate holder (12),
wherein the substrate holder (12) rests on an upper face of a susceptor (14) and is arranged above a heating device (6), with which the susceptor assembly (3) is heated, and
wherein a rotary drive (9) is configured to impart a rotation to the substrate holder (12), and the carrying element (20) carried by the substrate holder (12) around an axis of the susceptor assembly (3).

6. The device of claim 1, wherein at least one of:
an inner wall (18) of the pocket (17) lying opposite a circumferential wall (19) of the substrate holder (12) comprises a cover plate (15), which rests on a susceptor (14) that forms a carrying body, and whose upper face comprises the wide side plane (15') of the susceptor assembly (3), or
the upper face (26) of the carrying element (20) protrudes over the wide side plane (15') by a distance (e).

7. The device of claim 1, wherein the wide side plane (15') transitions into an inner face (18) of the pocket (17) with a chamfer (16), wherein a height of the chamfer (16) extending in a direction normal to the wide side plane (15') is greater than a distance between a lower face of the carrying element (20) that rests on a support flank (13) of the substrate holder (12), and the upper face (26) of the carrying element (20).

8. A carrying element (20), comprising:
a radially outer area (21); and
a radially inner area (22),
wherein the radially inner area (22) forms a support surface (23) for supporting an edge of a substrate (10),
wherein the radially outer area (21) has a limiting face (24) that faces a peripheral edge (10') of the substrate (10) and an upper face (26) that extends at least roughly in a plane parallel to the support surface (23),
wherein a cylindrical surface of the limiting face (24) transitions into the upper face (26) with a transitional area that is free of kinks and has a radius (R) greater than 0.4 mm, and
wherein a height (a) of the cylindrical surface of the limiting face (24) is greater than the radius (R) of the transitional area.

\* \* \* \* \*